US005631616A

United States Patent [19]
Ohta et al.

[11] Patent Number: 5,631,616
[45] Date of Patent: May 20, 1997

[54] MAGNETIC FIELD GENERATING DEVICE FOR USE IN MRI

[75] Inventors: Kimiharu Ohta, Takatsuki; Shigeo Hashimoto, Nishinomiya; Masahiro Yuki; Hideya Sakurai, both of Osaka, all of Japan

[73] Assignee: TDK Corporation, Tokyo, Japan

[21] Appl. No.: 417,037

[22] Filed: Apr. 5, 1995

[30] Foreign Application Priority Data

Jul. 8, 1994 [JP] Japan .................................. 6-180665

[51] Int. Cl.$^6$ ........................................................ H01F 1/00
[52] U.S. Cl. ............................ 335/216; 335/297; 324/318; 128/653.5
[58] Field of Search ................ 335/216, 296–301; 324/318, 319, 320; 128/653.5

[56] References Cited

U.S. PATENT DOCUMENTS

| | | | |
|---|---|---|---|
| 4,827,235 | 5/1989 | Inomata et al. | 335/297 |
| 5,045,637 | 9/1991 | Sato et al. | 174/35 MS |
| 5,319,297 | 5/1994 | Kaufman et al. | 335/297 |

*Primary Examiner*—Lincoln Donovan
*Attorney, Agent, or Firm*—Watson Cole Stevens Davis, PLLC

[57] ABSTRACT

A magnetic field generating device for use in MRI having a pair of pole pieces opposed at a space to each other and generating a magnetic field in the space, wherein the pole piece has a laminate structure in which a soft ferrite and a magnetic material base are disposed from the side of the space, and a layer of small magnetic permeability and high electric resistance is interposed between the soft ferrite and the magnetic material base. The soft ferrite may be lamination of the soft ferrite and silicon steel sheets. High speed image pick-up at high sensitivity and sharpness is enabled by reducing the eddy current and the remanent magnetism generated in the pole piece by the gradient magnetic field coils.

24 Claims, 11 Drawing Sheets

PRIOR ART

PRIOR ART

PRIOR ART

PRIOR ART

MAGNETIC FIELD GENERATING DEVICE FOR USE IN MRI

BACKGROUND OF THE INVENTION

1. Field of the Invention

The present invention relates to an improvement of a magnetic field generating device for use in a magnetic resonance imaging apparatus (hereinafter referred to as MRI) for medical treatment use and the like and, more in particular, it relates to an MRI magnetic field generating device intended for reducing eddy current in a pole piece and remanent magnetism by gradient magnetic field coils without deteriorating the uniformity of a magnetic field in the magnetic space thereby enabling high speed image pick-up by constituting a pair of pole pieces opposed at a space to each other as a laminate structure in which soft ferrite or a laminate silicon steel sheet and soft ferrite is disposed on a magnetic material base and interposing a layer of small magnetic permeability and high electric resistance between the soft ferrite and the magnetic material base or between the soft ferrite and the laminate silicon steel sheet.

2. Description of the Related Art

MRI is an apparatus capable of obtaining tomographic images of an object to visualize as far as the nature of tissues thereof by inserting a person to be diagnosed partially or wholly in a space of a magnetic field generating device that forms a strong magnetic field.

In the MRI magnetic field generating device, it is necessary that the space has such an extent as capable of inserting the person to be diagnosed partially or wholly, and it is required to form a stable and intense uniform magnetic field at 0.02 to 2.0 T and having accuracy of less than $1 \times 10^{-4}$ (usually) in an image pick-up view field in the space in order to obtain clear tomographic images.

As a magnetic field generating device used for MRI, it has been known a constitution as shown in FIG. 6(A) and (B), in which a pair of permanent magnet constituents 1, 1 using R-Fe-B type magnets are opposed to each other with pole pieces 2 and 2 being secured to respective one ends (as a magnetic field generating source) and connected at the other ends with yokes 3, to generate a static magnetic field in a space 4 between the pole pieces 2 and 2 (Japanese Patent Publication Hei 2-23010). The figure shows an embodiment in which yokes 3 are formed with a pair of plate yokes 3a and 3b and four columnar yokes 3c.

For the pole pieces 2 and 2, an arrangement of providing an annular protrusion 5 at the circumference and further disposing a convex protrusion (not illustrated) at a central portion is adopted in order to enhance the uniformity of a magnetic field distribution in the space 4 (Japanese Utility Model Publication Hei 5-37446).

Further, as the magnetic field generation source, it has been known to replace the above-mentioned permanent magnet constituents 1 and 1 with electromagnetic coils (including, for example, ordinary conductive coils and superconductive coils) wound around the periphery of a core (not illustrated) (Japanese Patent Laid-Open Hei 4-288137), in which pole pieces similar to those in FIG. 6 are used.

It has also been known a magnetic field generating device which is based on the constitution as shown in FIG. 6 and in which four columnar yokes 3c are replaced with a C-shaped yoke where a pair of plate yokes 3a and 3b are connected only at one ends by a plate yoke 3d (Japanese Design No. 847566) as shown in FIG. 7.

Further, as shown in FIG. 8, there has been also known a magnetic field generating device in which columnar yokes 3c are disposed to both ends of a pair of plate yokes 3a and 3b (at a position on or behind an imaginary line passing through the center of a permanent magnet constituent 1 and in perpendicular to the direction of inserting a person to be diagnosed) (Japanese Patent Laid-Open Hei 6-78893).

The constitutions shown in FIG. 7 and FIG. 8 have a merit, as compared with the constitution shown in FIG. 6, of being free in the direction of inserting the person to be diagnosed into the space 4 and gives no oppressive sensation on the person. Also, in these constitutions, pole pieces similar to those in FIG. 6 are used.

In a proposed magnetic field generating device of another constitution, as shown in FIG. 9, permanent magnet constituents 11, 11 of rectangular section and permanent magnet constituents 12, 12, 12, 12 of triangular section each made of a R-Fe-B type magnet are disposed as a magnetic field generation source on an inner circumferential surface of a polygonal (hexagonal in the drawing) cylindrical yoke 10 and, in particular, pole pieces 13 and 13 are secured to space-facing faces of a pair of permanent magnet constituents 11 and 11 of rectangular section forming a main magnetic field, thereby generating a static magnetic field in a space 14 between the pole pieces 13 and 13 (Japanese Patent Laid-Open Hei 6-151160).

For enhancing the uniformity of a magnetic field distribution in the space 14, the pair of pole pieces 13 and 13 are provided at both axial ends thereof with protrusions 15 and 15 each in the shape of a rectangular bar and in a central portion thereof with a protrusion 16 in the shape of a rectangular plate.

As described previously, various constitutions have been known for the magnetic field generating device for use in MRI. In any of such constitutions, pole pieces are disposed on the space-facing surfaces of the permanent magnet constituents in order to enhance the uniformity of the magnetic field distribution in the space 4, and the pole pieces usually comprise a bulk cut out from a magnetic material such as electromagnetic soft iron or pure iron.

In the MRI, gradient magnetic field coils (GC) comprising three sets of coil groups corresponding to three directions X, Y and Z are usually arranged near each of pole pieces disposed to the space-facing surfaces of the permanent magnet constituents (the gradient magnetic field coils are simply indicated by 6 in FIG. 6,) and a gradient magnetic field in a desired direction can be generated within the space by applying a pulse current to the gradient magnetic field coils.

Namely, positional information is given to nuclear magnetic resonance signals by applying a gradient magnetic field to the uniform magnetic field formed in the space, and it is necessary to apply a plurality of pulsative gradient magnetic fields in order to obtain images.

For instance, an ideal waveform of a magnetic field generated by gradient magnetic field coils is conceptionally illustrated in FIG. 10(A), which has a rectangular waveform with an extremely short period of time to reach a predetermined magnetic field intensity (rise and fall time), and has a symmetrical shape in which a wave height is equal between positive (+) and negative (−) sides ($B_1=B_2$). Further, the magnetic field intensity is reduced to 0 between adjacent rectangular waveforms.

However, since the pole pieces are disposed near the gradient magnetic field coils, when a pulse current is supplied to the gradient magnetic field coils, the magnetic field changes abruptly upon rise and fall of the pulse current to generate an eddy current in the pole pieces each comprising a bulk material made of electromagnet soft iron, pure iron or the like described above. In addition, the pole pieces are magnetized by the magnetic fields of the gradient magnetic field coils to disturb the uniformity of the magnetic field in the space due to magnetic hysteresis (remanent magnetism) in the pole pieces.

Generation of the eddy current or the remanent magnetism greatly disturbs the waveform of the magnetic fields generated by the gradient magnetic field coils.

Namely, as shown in FIG. 10(B), it requires much time to reach a predetermined magnetic field intensity (rise or fall time) and the wave height is different between the positive (+) and the negative (−) sides ($B_1 \neq B_2$) to form an asymmetric waveform. In the figure, a dotted line corresponds to an ideal waveform shown in FIG. 10(A). In addition, since this rectangular waveform is not an ideal waveform, the magnetic field intensity is not reduced to 0 between adjacent rectangular waveforms.

In recent years, since it has been required to pick-up further clear image at a high speed, a constitution of, for example, utilizing a pulse sequence of switching the gradient magnetic field at a high speed such as a FSE method (Fast Spin Echo) has often been adopted. However, when the waveform of the magnetic field generated by the gradient magnetic field coils shows an asymmetric waveform as shown in FIG. 10(B) due to the effect of the eddy current or the remanent magnetism, no aimed images can be obtained because of generation of signal error or the like.

The present applicant has proposed a MRI magnetic field generating device comprising various constitutions improved for pole pieces situated near the gradient magnetic field coils as means for dissolving the foregoing problems.

For instance, a pole piece 20 shown in FIG. 11 is adopted to the MRI magnetic field generating device, which is a pole piece comprising a so-called laminate structure having a constitution shown in FIG. 6, wherein a pure iron ring 22 of rectangular section is disposed at the periphery of a space-facing surface of a disc-shaped pure iron magnetic material base 21, and a plurality of block-shaped soft ferrite materials 23 are laid in a central portion (Japanese Patent Laid-Open Hei 4-23411).

In the drawing, a pure iron core 24 constitutes a substrate for mounting gradient magnetic field coils.

The applicant has further proposed a pole piece in which block-shaped laminate silicon steel sheet 26 comprising a plurality of silicon steel sheets laminated and integrated in a space-facing direction is laid as shown in FIG. 12 and FIG. 13, instead of the block-shaped soft ferrite 23 shown in FIG. 11 (Japanese Patent Laid-Open Hei 4-138131).

FIG. 12 shows block-shaped laminate silicon steel sheets 26 using directional silicon steel sheets in which a plurality of directional silicon steel sheets each having a directionality in one identical direction are previously laminated and integrated in the direction of the thickness to form sub-blocks 26a and 26b (arrow in the figure indicating the direction of axis of easy magnetization) and, subsequently, the sub blocks are laminated and integrated such that the directions of the axes of easy magnetization of the sub-blocks are in perpendicular to each other.

FIG. 13 shows block-shaped laminate silicon steel sheets 26 using non-directional silicon steel sheets in which they are merely laminated and integrated in the direction of the thickness irrespective of the directionality as in the constitution of FIG. 12.

The applicant has further proposed a pole piece 30 as shown in FIG. 14 in which the block-shaped laminate silicon steel sheets and block-shaped soft ferrite are effectively laminated and arranged (Japanese Patent Laid-Open Hei 5-182821).

That is, a pure iron ring 32 of rectangular section is disposed at the periphery of a space-facing surface of a disc-shaped pure iron magnetic material base 31, and block-shaped laminate silicon steel sheets 36 and a block-shaped soft ferrite 33 are laminate and arranged such that the laminate silicon steel sheets 36 abut against the magnetic material base 31 to form a pole piece.

FIG. 15 shows a pole piece 40 used for the MRI magnetic field generating device comprising the constitution as shown in FIG. 9, in which pure iron protrusions 42 each in the shape of a rectangular bar are disposed on both axial ends and block-shaped soft ferrite 43 is laid in a central portion on the space-facing surface of a magnetic material base 41 in the shape of a rectangular plate made of pure iron (Japanese Patent Laid-Open Hei 6-151160).

Also in this constitution, block-shaped laminate silicon steel sheets or the block-shaped laminate silicon steel sheets and the block-shape soft ferrite may be laminated and arranged in place of the block-shaped soft ferrite 43 at the central portion.

It is possible to reduce the eddy current and the remanent magnetism by the use of the pole piece having the soft ferrite or the silicon steel sheet arranged effectively, but a further improvement has still been demanded for MRI which adopts, for example, the FSE (Fast Spin Echo) method as explained previously.

That is, the demand for the improvement of the image clarity and shortening of the image pick-up time has been increased more and more, along which a pulse current applied to the gradient magnetic field coils tends to increase and the intensity of the magnetic field generated by the pulse current tends to increase further.

Although soft ferrite, having high electric resistance, is effective for reducing the generation of the eddy current, it tends to cause magnetic saturation due to a multiplier effect of the magnetic field by the magnetic field generating source and the magnetic field by the gradient magnetic field coils.

Therefore, also in the pole piece having the soft ferrite disposed to the space-facing surface, the magnetic flux density in the soft ferrite increases along with the increase of the magnetic field intensity by the gradient magnetic field coils to cause magnetic saturation partially or entirely, so that a portion of magnetic fluxes leaks to the magnetic material base or the laminate silicon steel sheet in contact with the magnetic saturation portion of the soft ferrite.

Accordingly, the leaked magnetic fluxes cause the eddy current and the remanent magnetism in the magnetic material base or the laminate silicon steel sheet.

For reducing the effect of the magnetic field by the gradient magnetic field coils on the magnetic material base or on the laminate silicon steel sheets, it may be considered to increase the thickness of the soft ferrite. However, this is not economical since the cost for the soft ferrite is increased, as well as increase for the thickness of the soft ferrite inevitably increases the entire thickness of the pole piece, which results in increase for the magnetic flux leakage from the outer circumferential surface of the pole piece to enlarge the scale of the device.

The laminate silicon steel sheets have higher saturation magnetic flux density (Bs) as compared with the soft ferrite and possess a merit of reducing the generation of the eddy current and easily attaining the enhancement for the uniformity of the magnetic field in the space. However, since the coercive force of the silicon steel is somewhat greater as compared with that of the soft ferrite, it is difficult to completely prevent the generation of the remanent magnetism to cause remanent magnetism at an order of several m Gauss, which disturbs uniformity, though little, of the magnetic field in the space particularly, in a pole piece in which the laminate silicon steel sheets are disposed on the space-facing surface.

OBJECT AND SUMMARY OF THE INVENTION

The present invention has been proposed in view of the foregoing situations of the pole piece used for the MRI magnetic field generating device, and it is an object thereof to provide a MRI magnetic field generating device having pole piece arranged so as to enable high speed pick-up of clear images at high sensitivity, by reducing the eddy current and the remanent magnetism generated in the pole pieces by the gradient magnetic field coils, without deteriorating the uniformity of the magnetic field in the space, in order to realize stable generation and erasing of the gradient magnetic field in a space of the magnetic circuit, for example, in the FSE method required for high speed image pick-up which is indispensable for the application use of MRI.

The present inventors, have made various studies on MRI magnetic field generating device for attaining the foregoing object and, as a result, have found that the eddy current and the remanent magnetism by the gradient magnetic field coils can be reduced without deteriorating the magnetic field intensity and the uniformity of the magnetic field thereby enabling high speed image pick-up, by constituting a pair of pole pieces opposing at a space to each other as a laminate structure in which soft ferrite or laminate silicon steel sheets and soft ferrite are disposed on a magnetic material base and interposing a layer of small magnetic permeability and high electric resistance between the soft ferrite and the magnetic material base or between the soft ferrite and the laminate silicon steel sheets, and have accomplished the present invention.

In other words, the present inventors, et al have made various studies for realizing stable generation and erasing of gradient magnetic field, for example, by a FSE method or the like required for high speed image pick-up in a space of a magnetic circuit of a MRI magnetic field generating device and have noted that nearly saturated portions are present partially in the pole piece of a laminate structure in which soft ferrite is disposed on a magnetic material base, as a result of examination for the magnetic circuit by means of an equi-magnetic flux density diagram. Then, on the assumption that if a gradient magnetic field is given in the above-mentioned state, pulsative magnetic fluxes passing through the soft ferrite can not pass the magnetic saturation portion but leak as if going round to the magnetic material base to generate the eddy current and the remanent magnetism in such portions, the inventors have made various studies for the means capable of eliminating such disadvantageous mechanisms and found that the eddy current and the remanent magnetism are scarcely generated even under the effect of the gradient magnetic field by interposing a synthetic resin layer or the like of small magnetic permeability and high electric resistance between the magnetic material base and the soft ferrite. It is considered that the synthetic resin layer forms a magnetic gap which should usually be avoided in customary design for the magnetic circuit but it can eliminate the magnetic saturation portions to permit smooth passage of the pulsative magnetic fluxes through the magnetic circuit and the inventors have found that a similar effect can also be obtained by interposing the synthetic resin layer between the laminate silicon steel sheets and the soft ferrite in the constitution of the pole piece in which the laminate silicon steel sheets and the soft ferrite are disposed on the magnetic material base and have accomplished the present invention.

Thus, the present invention provides a MRI magnetic field generating device having a pair of pole pieces opposed at a space to each other and generating a magnetic field in the space, wherein the pole piece comprises a laminate structure of disposing a soft ferrite and a magnetic material base from the side of the space, and a layer of small magnetic permeability and high electric resistance is interposed between the soft ferrite and the magnetic material base.

The present invention further provides a MRI magnetic field generating device having a pair of pole pieces opposed at a space to each other and generating a magnetic field in the space, wherein the pole piece comprises a laminate structure of disposing a soft ferrite, laminate silicon steel sheets and a magnetic material base from the side of the space, and a layer of small magnetic permeability and high electric resistance is interposed between the soft ferrite and the laminate silicon steel sheets.

In a preferred embodiment of the present invention, the layer of small magnetic permeability and high electric resistance is preferably a synthetic resin layer.

In another embodiment of the present invention, the magnetic material base is in the shape of a disc, and an annular protrusion comprising a magnetic material ring having one or more diametrical slit is disposed on the space-facing surface of the pole piece, which further improves the uniformity of the magnetic field.

In a further embodiment of the present invention, the magnetic material base is in the shape of a rectangular plate, and protrusions each in the shape of a rectangular bar comprising a magnetic material are disposed on both axial ends on the space-facing surface of the pole piece, which further improves the uniformity of the magnetic field.

The MRI magnetic field generating apparatus in accordance with the present invention can be applied, not being restricted to embodiments described later, to any of constitution so long as a pair of pole pieces opposed at a space to each other are provided to generate a magnetic field in the space.

That is, the magnet constituent as the magnetic field generating source is not restricted to the permanent magnet but electromagnetic coils (including ordinary conductive coils and super-conductive coils) wound around a core may also be used and the pole pieces are not necessarily be disposed directly to the magnet constituent. Further, the yoke for forming a magnetic circuit that magnetically connects the magnet constituent and the pair of pole pieces to generate the magnetic field in the space may have optional shape and size which are selected properly depending on various required characteristics such as the size of the space, magnetic field intensity and magnetic field uniformity.

In a case of using the permanent magnet as the magnet constituent for the magnetic field generating source, known magnet such as ferrite magnet and rare earth cobalt system magnet can be used. Particularly, the size of the permanent magnet can be reduced remarkably by using a Fe-B-R type permanent magnet wherein R is resourceful light rare earth metal mainly comprising Nd or Pr and B and Fe are main ingredients and exhibiting an extremely high energy product of greater than 30 MGOe. In addition, combined arrangement of such known permanent magnets can provide a magnetic field generating apparatus of excellent economical performance with no remarkable hindrance for the size reduction of the device.

In the present invention, as the magnetic material base constituting the pole pieces, known material for the pole pieces such as electromagnetic soft iron and pure iron can be used. The magnetic material base can provide uniform magnetic intensity, ensure the mechanical strength for the entire pole piece and enhance the operation efficiency upon assembling the magnetic field generating device.

In the present invention, various soft ferrites such as Mn-Zn ferrite and Ni-Zn ferrite can be used for the soft ferrite constituting the pole piece, and it is desirable that the soft ferrite has a high electric resistance for attaining the reduction of the eddy current and it is preferred to select such a material as having a specific resistivity $\rho$ of greater than $10^{-5}$ $\Omega \cdot m$, preferably, greater than $10^{-3}$ $\Omega \cdot m$, more preferably, greater than $10^{-2}$ $\Omega \cdot m$ and, particularly preferably, greater than $10^{-1}$ $\Omega \cdot m$. Further, for guiding magnetic fluxes generated from the magnet constituent into the space, it is desirable that the magnetic permeability is high and it is preferred to select such a material having a maximum magnetic permeability (hereinafter referred to as permeability $\mu$) of greater than 1000 and, more preferably, greater than 5000.

Further, for preventing the remanent magnetism it is desirable that the coercive force is small and, for example, it is preferred to select such a material as having coercive force Hc of less than 20 A/m, more preferably, less than 10 A/m.

Further, for reducing the magnetic saturation due to synergistic effect of the magnetic field by the magnet constituent and the magnetic field by the gradient magnetic field coils, it is desirable that the material has a high saturation magnetic flux density Bs and it is preferred that the material has a saturation magnetic flux density Bs of greater than 0.4 T and, preferably, greater than 0.5 T.

As the soft ferrite satisfying the various conditions most preferably, Mn-Zn type soft ferrite is most desirable.

When the soft ferrite made of the above-mentioned material is disposed to the pole piece, a block obtained by known compression molding process and fabricated into a required shape, or small blocks each fabricated into a predetermined size and assembled into a predetermined shape by means of an adhesive such as an epoxy resin can be utilized and easily laid to a predetermined position with good operation efficiency.

In the present invention, the laminating direction of the laminate silicon steel sheets is not restricted only to the direction in the embodiments but lamination in the opposing direction (gap facing direction) of the pole piece can facilitate assembling of the block-shaped laminate silicon steel sheets and this is desirable also in view of the mechanical strength or the like.

Further, in a case of using a directional silicon steel sheet, for example, (JIS C2553), laminating as described with reference to FIG. 12 is preferred. In a case of using a non-directional silicon steel sheet (for example, JIS C2552), the laminate constitution as described with reference to FIG. 13 is preferred. Particularly, use of the non-directional silicon steel sheet can provide a remarkable effect for the reduction of the remanent magnetism.

It is necessary, also for the silicon steel sheet, to select a preferred material among various materials for attaining the object of the present invention like that for the soft ferrite described above. Particularly, it is desirable for the permeability $\mu$, to select a material having the permeability $\mu$ not less than the permeability 11 of the soft ferrite. It is, desirably, as high as possible, and at least greater than 4000 and, preferably, greater than 10,000. Further, it is also desirable that the saturation magnetic flux density Bs is as high as possible and it is desirable to select a material having the saturation magnetic flux density Bs of greater than 1.5 T. Further, in view of the reduction of the remanent magnetism, the coercive force Hc is desirably as small as possible and, in a case of the non-directional silicon steel sheet, it is desirable to select a material having the coercive force of less than 50 A/m. In view of the reduction of the eddy current, the electric resistance is desirably as high as possible and it is preferred to select a material having a specific resistivity $\rho$ of greater than $30 \times 10^{-8}$ $\Omega \cdot m$ and, preferably, greater than $40 \times 10^{-8}$ $\Omega \cdot m$.

The silicon steel sheet may have optional thickness. Since easily available silicon steel sheet generally has a thickness as thin as about 0.35 mm and it is difficult to handle with, a plurality of silicon steel sheets previously cut, for example, into a rectangular shape of a predetermined size may be laminated in a predetermined direction and integrated into a block shape, by which they can be laid to a predetermined position of the pole piece at a good operation efficiency.

The object of the present invention can be attained efficiently by the combined use of the laminate silicon steel sheet with the soft ferrite.

Namely, it has been confirmed by the experiment conducted by the present inventors that the soft ferrite has an effect of reducing the remanent magnetism superior to that of the laminate silicon steel sheet, but it involves a problem in view of the symmetricity of the magnetic field waveform, as well as that the laminate silicon steel sheet enhances the symmetricity of the magnetic field waveform as compared with the soft ferrite but it involves a problem in view of the remanent magnetism (refer to FIG. 10(B)).

Accordingly, by optimizing the amount of lamination (size) of the soft ferrite and the laminate silicon steel sheets, respective merits of them can be utilized effectively. In particular, a great economical merit can be obtained since the laminate silicon steel sheet is less expensive as compared with the soft ferrite.

A layer of small permeability and high electric resistance as a main feature of the present invention has to be formed between the soft ferrite and the magnetic material base in a case of a pole piece comprising a lamination of the soft ferrite and the magnetic material base, or it has to be formed between the soft ferrite and the laminate silicon steel sheets in a case of a pole piece comprising a lamination of the soft ferrite, the laminate silicon steel sheets and the magnetic material base.

That is, the layer of small magnetic permeability and high electric resistance formed to the pole piece can prevent magnetic saturation in the soft ferrite caused by the magnetic field from the magnetic field generating source such as a permanent magnet constituent, results in no magnetic saturation in the soft ferrite partially or entirely even under the effect of the magnetic field by the gradient magnetic field coils, can reduce the leakage of magnetic fluxes from the soft ferrite to the magnetic material base or the laminate silicon steel sheets and, as a result, enables to reduce the generation of the eddy current and the remanent magnetism in the magnetic material base or the laminate silicon steel sheets caused by the magnetic field by the gradient magnetic field coils.

As apparent from the foregoings, for preventing the magnetic saturation in the soft ferrite by the magnetic field from the magnetic field generating source by disposing a layer between the soft ferrite and the magnetic material base or a layer formed between the soft ferrite and the laminate silicon steel sheet, it is necessary that the layer has a small magnetic permeability, that is, a high magnetic resistance, and use of various non-magnetic materials may be considered. However, if the layer is made of a material of low electric resistance (high electroconductivity) such as copper or aluminum, the layer itself generates the eddy current and, therefore, a material of high electric resistance has to be selected.

According to the experiment of the present inventors, it is usually desirable to select an industrially available material having a magnetic permeability of about 1 and a material having a specific resistivity $\rho$ equal with or greater than the specific resistivity of the soft ferrite constituting the pole piece (for example, greater than 0.2 $\Omega\cdot$m) with respect to the electric resistance. Then, use of a plate made of a synthetic resin such as vinyl chloride, polyethylene, epoxy resin and phenol resin (bakelite) is desirable also in view of handling.

Further, a similar effect can also be obtained, for example, with a constitution of disposing a small protrusion made of a synthetic resin to each of the block-shaped soft ferrite on the side of the magnetic material base or on the side of the laminate silicon steel sheets, thereby forming a substantial air layer between the soft ferrite and the magnetic material base or the laminate silicon steel sheets.

In addition, ceramics such as alumina or silicon nitride, hardwood such as plywood and fiberboard such as MDF can also be used.

The layer of small magnetic permeability and high electric resistance described above is essential for attaining the purpose of the present invention but if the thickness of layer is excessively large, it increases the magnetic resistance excessively to result in increased loss of the magnetmotive force of the magnetic field generating source and, as a result, lowering the magnetic field intensity in the space. That is, the magnetic efficiency of the magnetic circuit is deteriorated.

On the other hand, if the thickness of the layer is reduced unnecessarily, no intended effect of the layer can be obtained. Then, the thickness of the layer is desirably selected with a consideration to the shape, size and the material for each of the components constituting the pole piece, magnetic characteristic of the magnetic field generating source, characteristic of the gradient magnetic field coils, magnetic field intensity in the space, etc. For instance, the thickness is desirably set within a range of 0.5 mm to 5 mm both in a case of a generally disc-shaped pole piece having an outer diameter of about 1 m–1.5 m and a rectangular plate-shaped pole piece of about 0.4 m–1 m width×1 m–1.5 m length employed so far.

In the present invention, the mechanical strength of the pole piece can be ensured and the effects of making the magnetic field intensity uniform and preventing the eddy current and the remanent magnetism required for the pole piece can be maximized by optimizing the thickness of the layer of small magnetic permeability and electric resistance and, as well as optimizing the ratio of thickness for each of the components constituting the pole piece.

For example, in a constitution having the soft ferrite, the layer of small magnetic permeability and high electric resistance and the magnetic base material, it is desirable that the ratio of thickness (ratio at the maximum thickness for each of the components) within a range of 5–50:0.5–5:10–50. In a constitution having the soft ferrite, the layer of small magnetic permeability and high electric resistance, the laminate silicon steel sheets and the magnetic material base, the ratio of the thickness for each of them is desirably selected within a range: 3–15:0.5–5:2–35:10–50.

Further, in the present invention, for enhancing the magnetic field uniformity in the space, the soft ferrite or the laminate structure of the laminate silicon steel sheets and the soft ferrite is formed only to a central portion of a space-facing surface of the disc-shaped magnetic material base or rectangular plate-shaped magnetic material base, and protrusion comprising a magnetic material ring or a magnetic material bar made, for example, of electromagnetic soft iron or pure iron formed to the circumferential edge of the disc-shaped magnetic material base or to the both axial ends of the rectangular plate-shaped magnetic material base.

The magnetic material ring or the magnetic material bar is desirably insulated electrically from the magnetic material base with an aim of reducing the effect of the eddy current. Particularly, the magnetic material ring is desirably divided by disposing one or more of slits in the circumferential direction.

DESCRIPTION OF THE PREFERRED EMBODIMENTS

Figure 1:
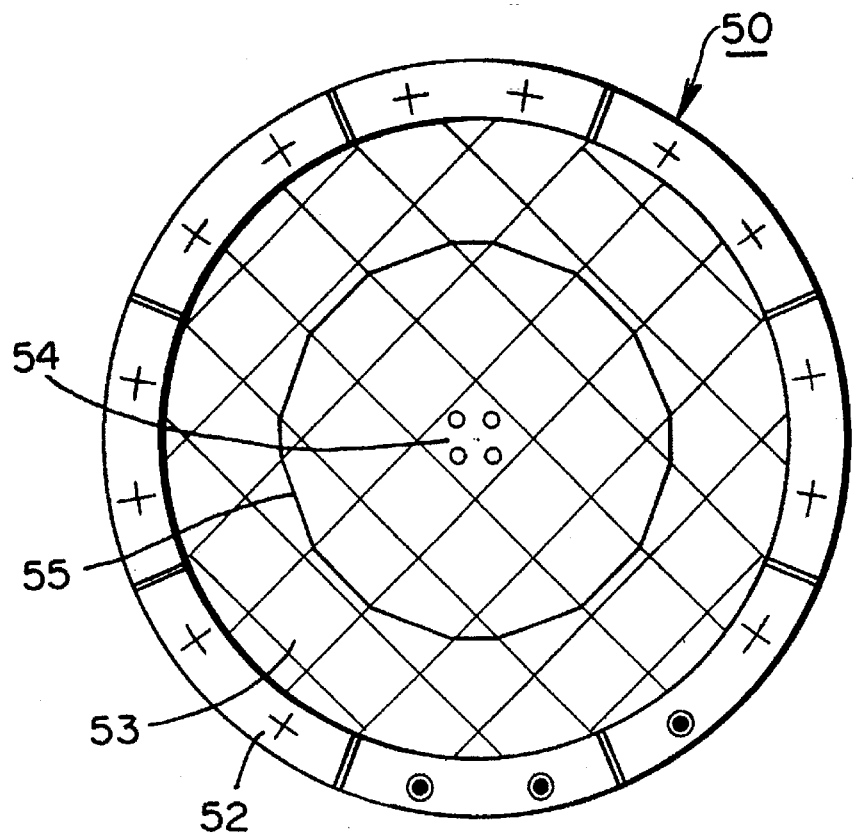
FIGS. 1(A) and 1(B) are upper plan view and vertical cross sectional view of one embodiment of a pole piece in a magnetic field generating device according to the present invention.
Figure 1:
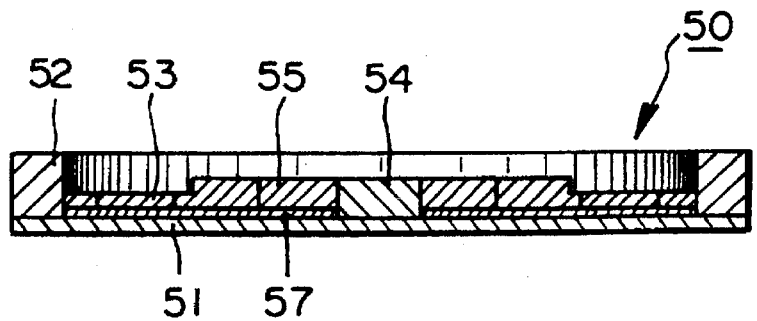
Figure 2:
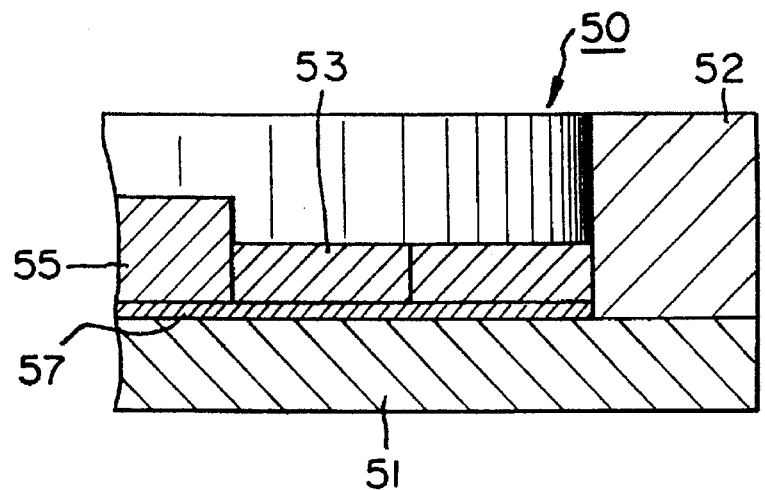
FIG. 2 is a fragmentary enlarged vertical cross sectional view of the pole piece shown in FIG. 1(B)

FIGS. 1(A) and (B) are upper plan view and vertical cross sectional view illustrating a preferred embodiment of a pole piece in a magnetic generating device according to the present invention and FIG. 2 is a fragmentary enlarged vertical cross sectional view for a portion in FIG. 1.

Figure 3:
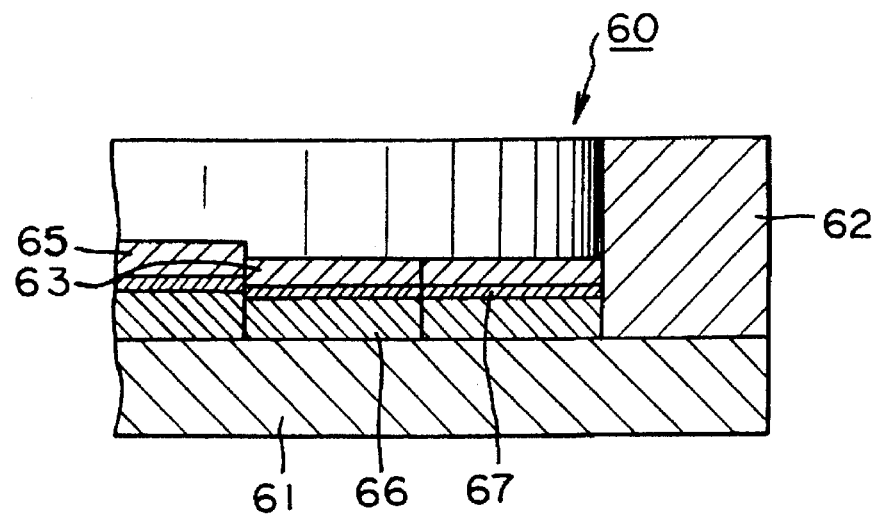
FIG. 3 is a fragmentary vertical cross sectional view illustrating another constitution of the pole piece according to the present invention.

FIG. 3 is a fragmentary vertical cross sectional view illustrating another embodiment of a pole piece in a magnetic field generating device according to the present invention.

A pole piece 50 shown in FIGS. 1 and 2 comprises a disc-shaped magnetic material base 51 made of pure iron, on the upper surface of which are laid a plurality of block-shaped soft ferrite 53 by way of a thin bakelite plate 57 disposed as a layer of a small magnetic permeability and high electric resistance. The block-shaped soft ferrite 53 is usually secured on the thin bakelite plate 57 by means of a synthetic epoxy resin adhesive.

In the figure, an annular ring 52 made of pure iron and a core 54 made of soft iron constitute a substrate for mounting gradient magnetic field coils.

A convex protrusion 55 formed by adjusting the thickness of the block-shaped soft ferrite 53 is disposed in a central portion of the pole piece 50, by which the magnetic field uniformity in the space can further be enhanced by the multiplier effect with the annular ring 52.

Figure 11:
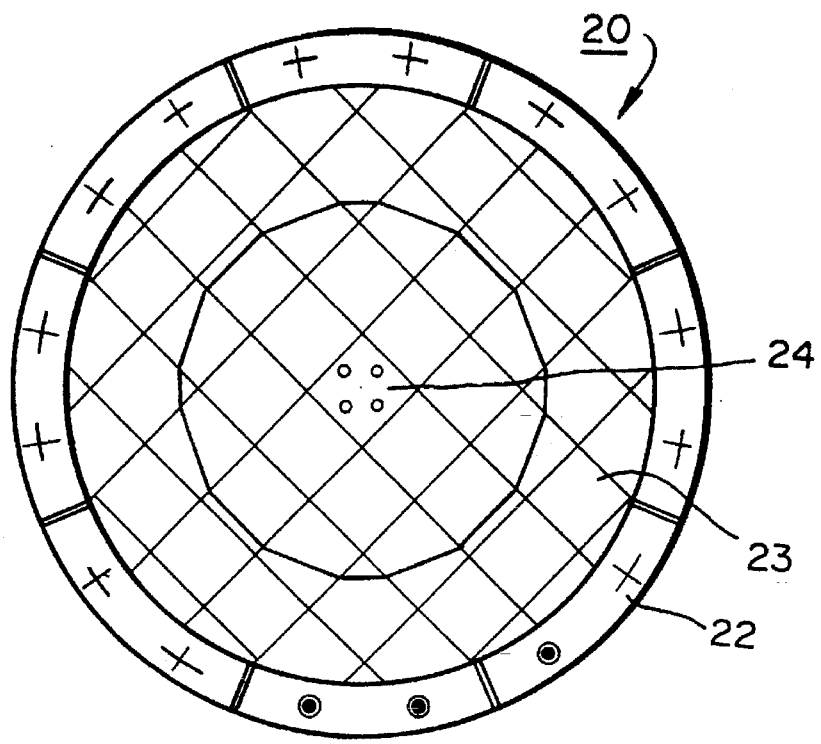
FIGS. 11 (A) and (B) are upper plan view and transverse cross sectional view illustrating an embodiment of a pole piece in an existent magnetic field generating device.
Figure 11:
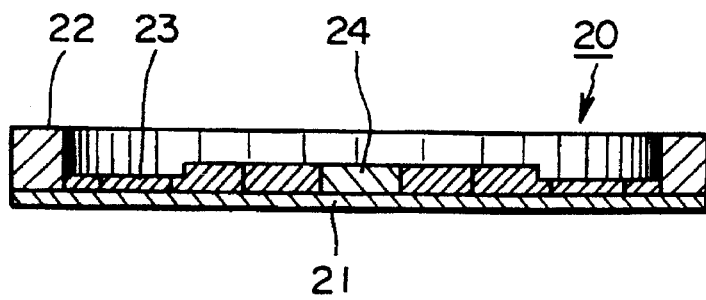
Figure 12:
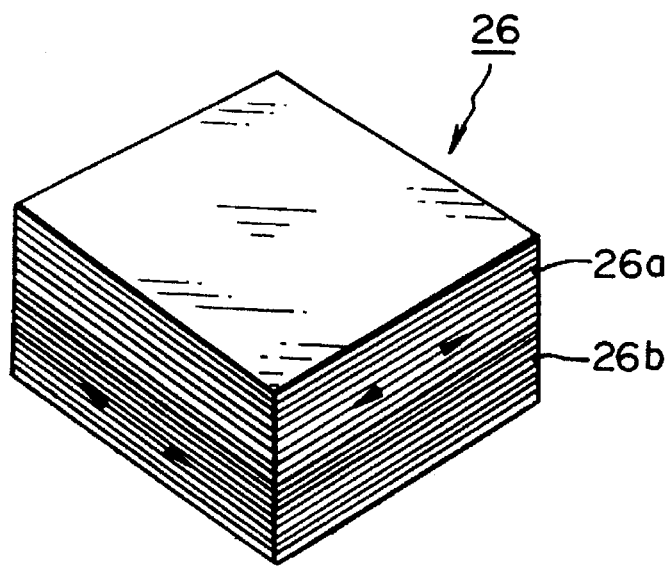
FIG. 12 is an explanatory perspective view illustrating an embodiment of block-shaped laminate silicon steel sheets.
Figure 13:
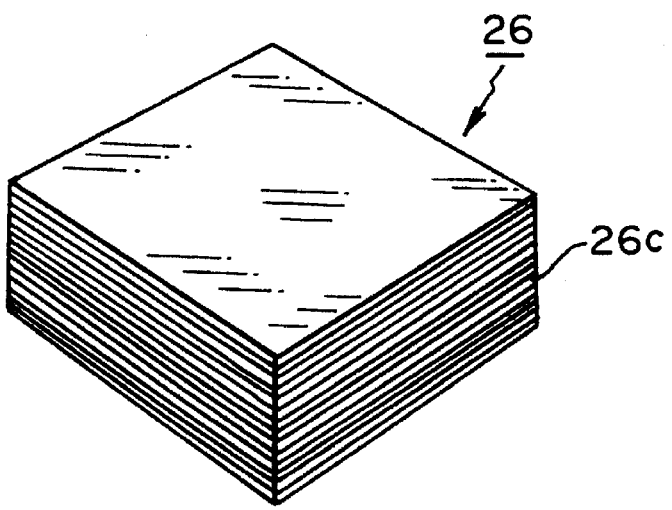
FIG. 13 is an explanatory perspective view illustrating another embodiment of block-shaped laminate silicon steels sheet.
Figure 14:
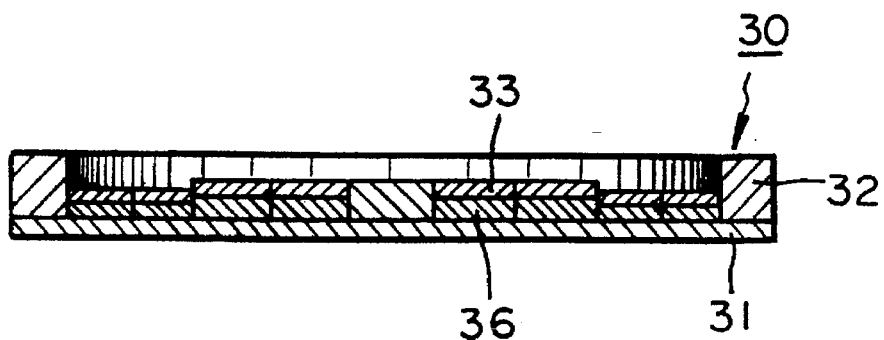
FIG. 14 is a vertical cross sectional view illustrating a constitution of a pole piece used in a magnetic field generating device shown in FIG. 6.

A pole piece 60 shown in FIG. 3 comprises a constitution formed by laying a plurality of block-shaped laminate steel sheets 66 laminated by using non-directional silicon steel sheets on the upper surface of a disc-shaped magnetic material base 61 made of pure iron (refer to FIG. 11) and, further, laying a plurality of block-shaped soft ferrites 63 by way of a layer comprising a thin bakelite plate 67 of a small magnetic permeability and a high electric resistance.

The block-shaped laminate silicon steel sheet 66 and the block-shaped soft ferrite 63 are also secured by using a synthesized epoxy resin adhesive in the same manner as the constitution described above.

In the figure, an annular ring 62 made of pure iron, and a convex protrusion 65 is formed by adjusting the thickness of the block-shaped laminate silicon steel sheets 66 and the block-shaped soft ferrite 63.

Figure 15:
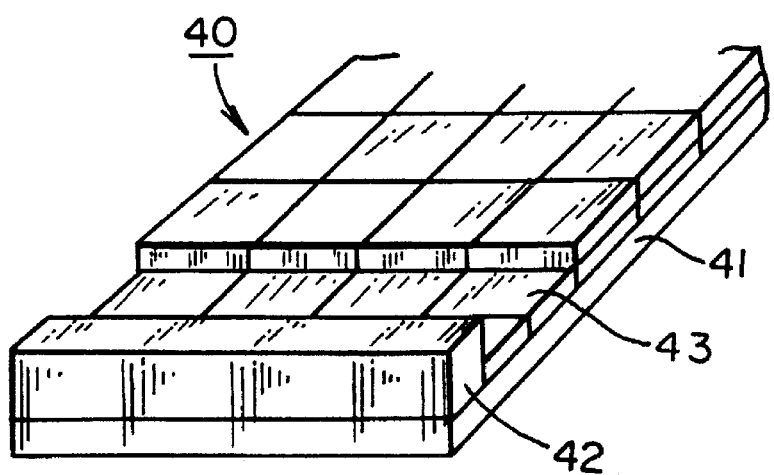
FIG. 15 is a vertical cross sectional view illustrating a constitution of a pole piece used in a magnetic field generating device shown in FIG. 9.

Also in a pole piece using a magnetic material base 41 in the shape of a rectangular plate shown in FIG. 15, a similar effect as that in the pole piece comprising a constitution of using the disc-shaped magnetic material base can be obtained by interposing a layer made of thin bakelite plate of a small magnetic permeability and high electric resistance between the block-shaped soft ferrite 43 and the magnetic material base 41, or between the block-shaped soft ferrite and the laminate silicon steel sheets (not illustrated).

When the pole piece comprising the foregoing constitution according to the present invention is used for the MRI magnetic field generating device, the layer of small magnetic permeability and high electric resistance formed at a predetermined position can prevent magnetic saturation in the soft ferrite by the magnetic field from the magnetic field generating source such as a permanent magnet constituent, results in no magnetic saturation in the soft ferrite partially or entirely even under the effect of the magnetic field by the gradient magnetic field coils, and reduce the leakage of magnetic fluxes from the soft ferrite to the magnetic material base or the laminate silicon steel sheets. As a result, this can reduce the generation of the eddy current and the remanent magnetism in the magnetic material base or the laminate silicon steel sheets caused by the gradient magnetic field coils, thereby enabling to realize stable generation and erasing of the gradient magnetic field by the FSE method or the like required for high speed image pick-up by pulse sequence in the space of the magnetic circuit.

Figure 10:
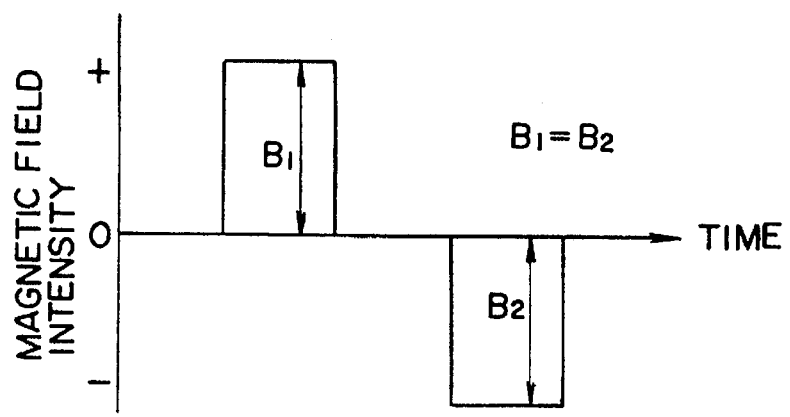
FIGS. 10 (A), (B) and (C) are graphs illustrating a relationship between time and magnetic field intensity expressing a magnetic field waveform generated by gradient magnetic field coils.
Figure 10:
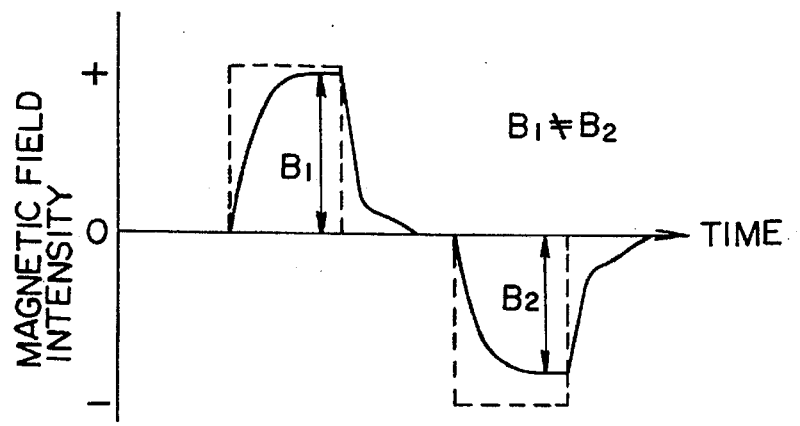
Figure 10:
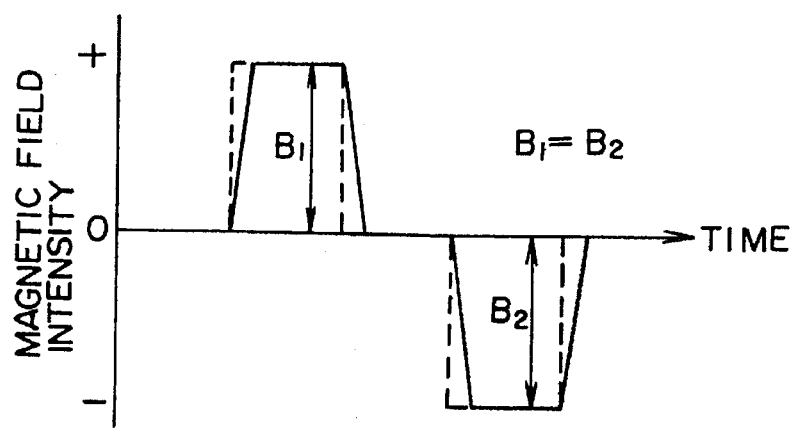

As will be apparent from the preferred embodiments, the magnetic field waveform generated by the gradient magnetic field coils scarcely shows the magnetic field disturbance caused by the remanent magnetism as shown in FIG. 10 and the generation of the eddy current is also decreased significantly, so that the magnetic field waveform is in a substantially same shape as the ideal rectangular wave in FIG. 10(A). That is, clear images can be obtained by high speed image pick-up.

PREFERRED EMBODIMENT

EXAMPLE 1

Figure 8:
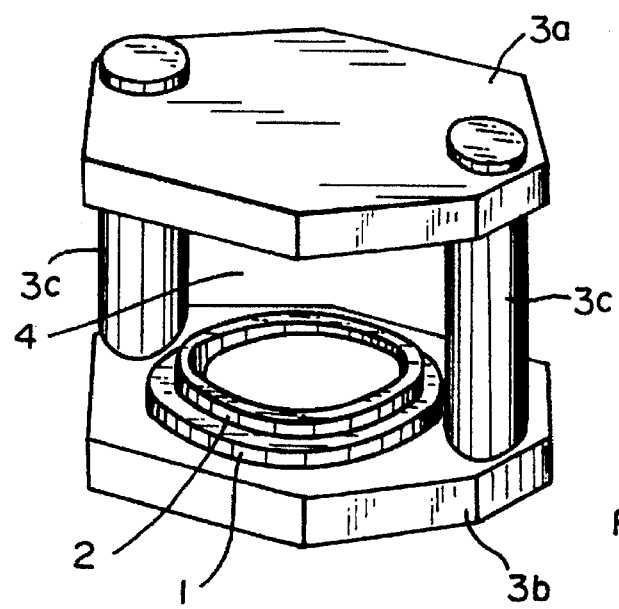
FIG. 8 is an explanatory perspective view of an existent magnetic field generating device.
Figure 9:
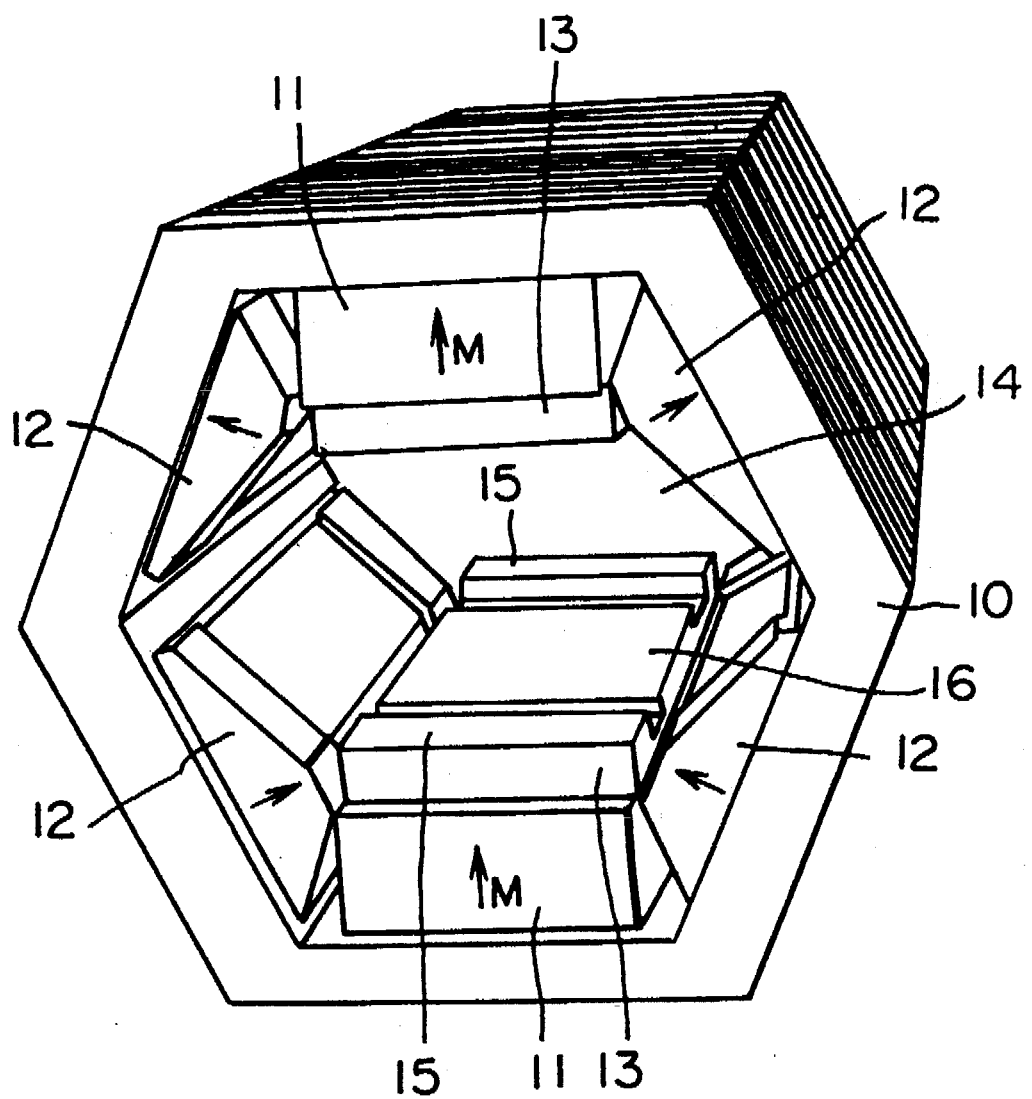
FIG. 9 is an explanatory perspective view of an existent magnetic field generating device.

In a magnetic field generating device having the same constitution as that in FIG. 8, a Nd-Fe-B system permanent magnet sized 1300 mm outer diameter×190 mm inner diameter×150 mm thickness and having 40 MGOe of (BH) max was used and a pole piece 50 was secured thereto. The pole piece 50 had a constitution formed by circumferentially disposing an annular protrusion 52 made of low carbon steel sized 1200 mm outer diameter×1000 mm inner diameter×70 mm thickness on a magnetic material base 51 made of pure iron sized 1200 mm outer diameter×40 mm thickness, and laminating a soft ferrite layer sized 1000 mm outer diameter×25 mm thickness (central portion) assembled from a block-shaped soft ferrite 53 into disk-like shape having a convex protrusion 55 by way of a thin bakelite plate 57 sized 1000 mm outer diameter×1 mm thickness.

The soft ferrite was a Mn-Zn system ferrite and had Hc=6.0 A/m, Bs=0.54 T, µ=6000, 0.2Ω·m. The pure iron had: Hc=80 A/m, Bs=2.0 T, µ=5000, ρ=1×10$^{-7}$ Ω·m. The bakelite had µ=1, ρ=1×10$^{11}$, Ω·m.

When the distance between the opposing surfaces of a pair of upper and lower annular protrusions was set to 500 mm, the magnetic field intensity was 0.3 T, and the uniformity of the magnetic field in a measured space within 200 mm of radius around the center of the space was 30 ppm. The magnetic flux density in this embodiment was calculated by simulation using a finite element method and the result is shown as an equi-magnetic flux density diagram in FIG. 4.

Further, the result of the measurement of the residual magnetic field and the eddy current caused upon generation of a gradient magnetic field (8 m T/m) by the pulse current in the gradient magnetic field coil at a pulse width of 10 ms and the result of the measurement is shown in Table 1.

COMPARATIVE EXAMPLE 1

For the magnetic field generating device of the same constitution as in Example 1 except for not interposing the thin bakelite plate 57 to the pole piece, magnetic characteristics were measured in the same manner. Magnetic field uniformity of 30 ppm and the magnetic field intensity of 0.3 T were obtained by measurement within 200 mm radius around the center of the space. The magnetic flux density in this embodiment was calculated by simulation using the finite element method and the result is shown as an equi-magnetic flux density diagram in FIG. 5.

Further, the result of the measurement of the residual magnetic field and the eddy current caused upon generation of the gradient magnetic field (8 mT/m) by the pulse current in the gradient magnetic field coil at a pulse width of 10 ms and the result of the measurement is shown in Table 1.

Figure 4:
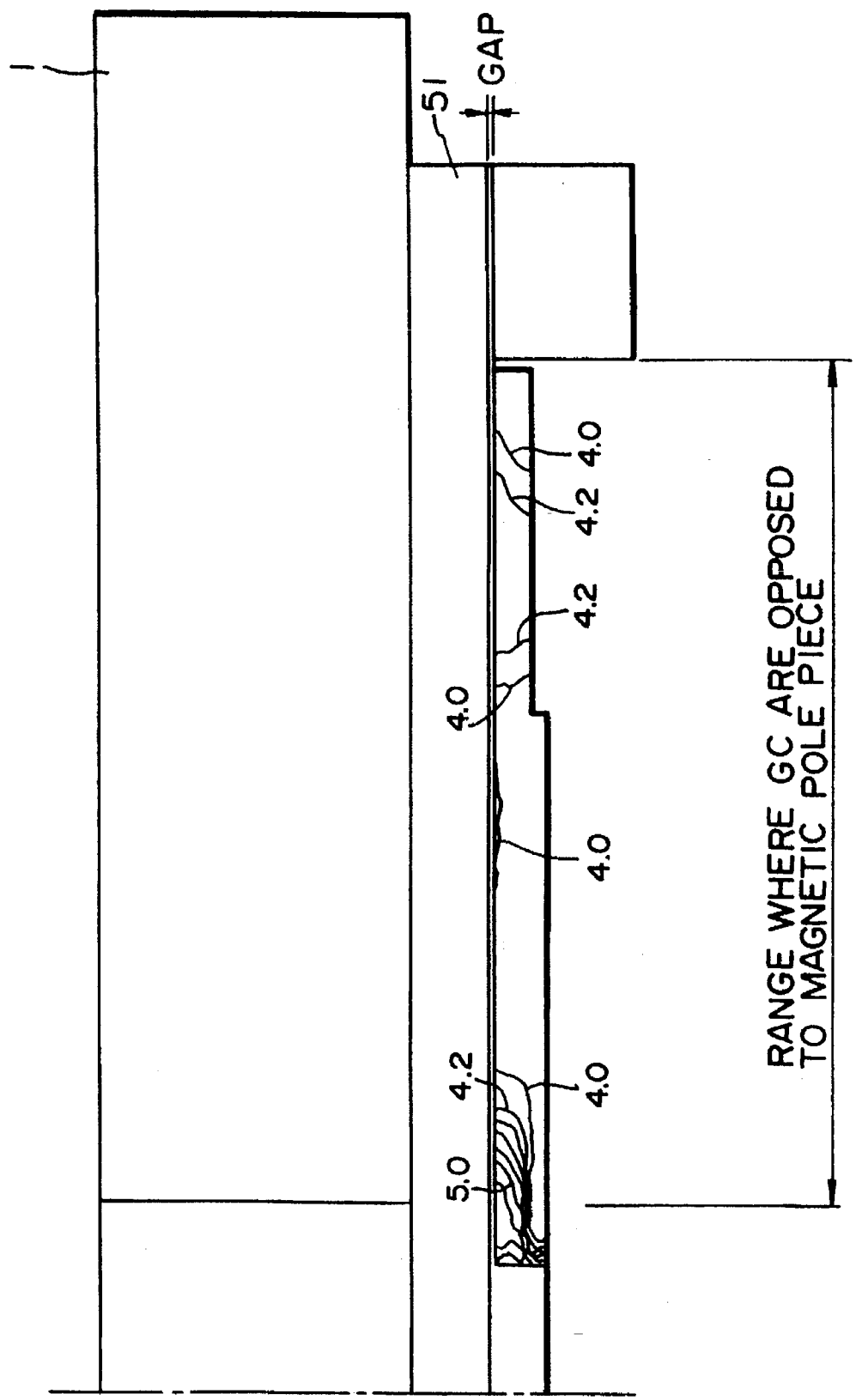
FIG. 4 is an equi-magnetic flux density diagram for a pole piece in the magnetic field generating device according to the present invention.
Figure 5:
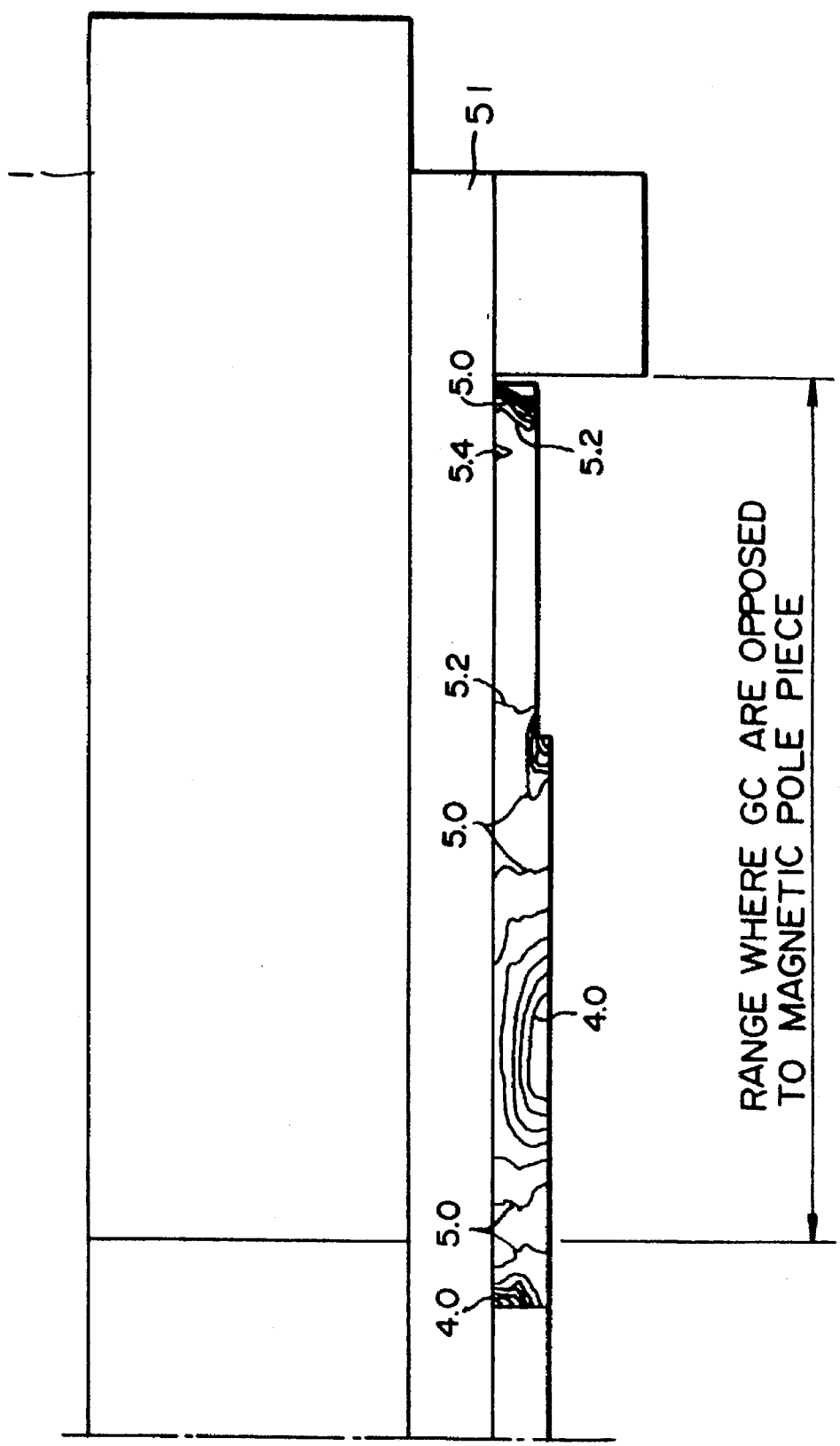
FIG. 5 is an equi-magnetic flux density diagram for a pole piece in the magnetic field generating device in a comparative embodiment.
Figure 6:
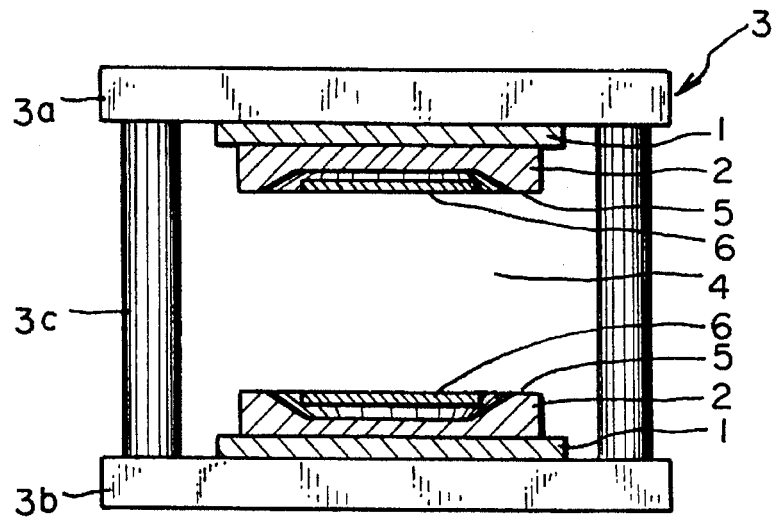
FIGS. 6(A) and (B) are vertical cross sectional view and transverse cross sectional view of an existent magnetic field generating device.
Figure 6:
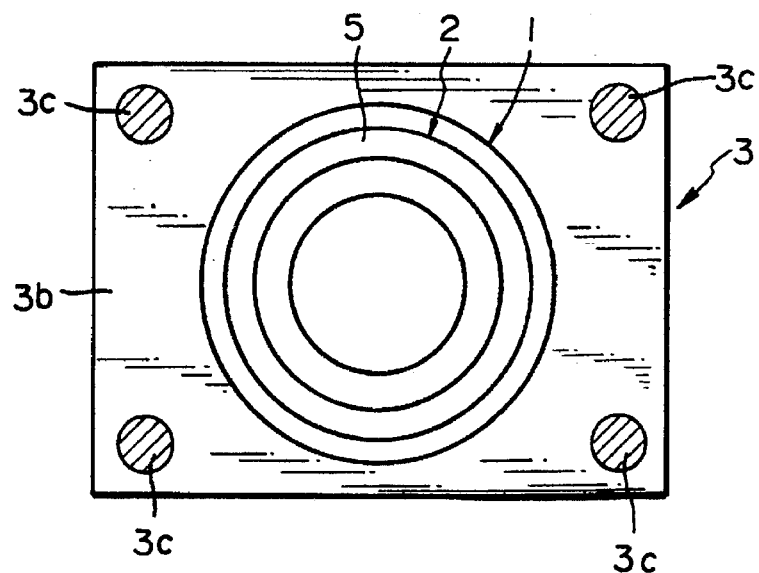
Figure 7:
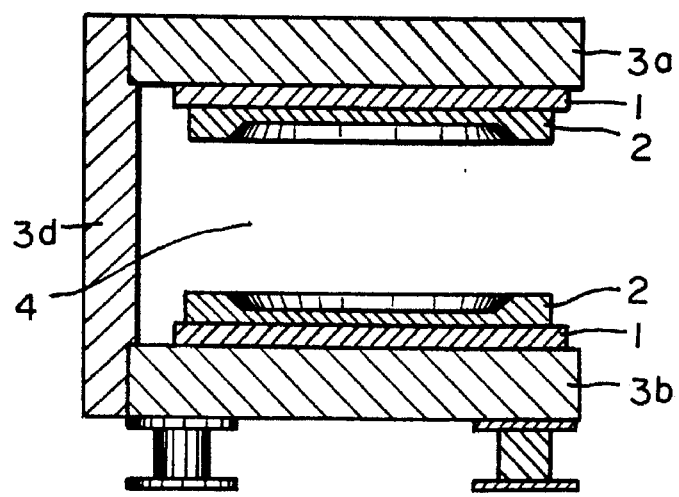
FIG. 7 is a vertical cross sectional view of an existent magnetic field generating device.

In the isomagnetic flux density diagrams shown in FIG. 4 and FIG. 5, numerical values shown on equi-magnetic flux density curves are magnetic flux density kG, indicating that the magnetic flux density is identical on one identical curve. As apparent from the diagrams within a range where the gradient magnetic field coils (GC) are opposed to the magnetic pole piece, the magnetic flux density is from 5.0 to 5.4 KG which is nearly in a magnetic saturation state in a case of Comparative Example 1, whereas the magnetic flux density is from 4.0 to 4.2 kG indicating that no magnetic saturation occurs upon application of gradient magnetic field in the case of Example 1.

EXAMPLE 2

In the constitution of Example 1, the pole piece 60 shown in FIG. 3 was attached to the permanent magnet. The pole piece 60 comprised a constitution formed by circumferentially disposing an annular protrusion 62 made of low carbon steel sized 1200 mm outer diameter×1000 mm inner diameter×70 mm thickness on a magnetic material base 61 made of pure iron sized 1200 mm outer diameter×40 mm thickness, disposing a disk-shaped silicon steel sheet layer sized 1000 mm outer diameter×15 mm thickness (central portion) composed of a block-shaped laminate silicon steel sheets 66 by using non-directional silicon steel sheets having the below specified property within the annular protrusion 62 and, further, laminating a soft ferrite layer sized 1000 mm outer diameter×10 mm thickness (central portion) assembled from block-shaped soft ferrite 63 into a disk-like shape having a convex protrusion 65 by way of a thin bakelite plate 67 sized 1000 mm outer diameter×1 mm thickness.

The non-directional silicon steel had Hc=40 A/m, Bs=1.7 T, μ=12000, ρ=45×10$^{-8}$. Ω·m.

When the magnetic characteristics were measured in the same manner, for the magnetic field generating device having the foregoing constitution, 30 ppm of magnetic field uniformity and 0.3 T of magnetic field intensity were obtained within 200 mm radius around the center of the space. Further, the residual magnetic field and the eddy current caused upon generation of the gradient magnetic field (8 mT/m) by the pulse current in the gradient magnetic field coils at a pulse width of 10 ms were measured and the result of measurement is shown in Table 1.

The remanent magnetic field is 4 mG in a case of the comparative example 1 in which the soft ferrite layer was disposed directly to the magnetic material base, whereas the remanent magnetic field was reduced to less than one-half of the comparative example 1 in each of examples where in Example 1 the soft ferrite layer was laminated on the magnetic material base with the thin bakelite plate being interposed between them and in Example 2 the thin bakelite plate is interposed between the silicon steel sheet and the soft ferrite layer.

Further, the eddy current is shown as a ratio with respect to the value in the comparative example being assumed as "1". It can be seen that the ratio is greatly reduced in each of Examples 1 and 2.

TABLE 1

|  | Remanent magnetic field | Eddy current |
| --- | --- | --- |
| Example 1 | 1.5 mG | 1/4 |
| Example 2 | 2.0 mG | 1/5 |
| Comp. Exam 1 | 4 mG | 1 |

According to the present invention, since a pair of pole pieces opposed at a space to each other are constituted as a laminate structure in which a soft ferrite or laminate silicon steel sheets and a soft ferrite are disposed on a magnetic material base, and a layer of small magnetic permeability and high electric resistance such as a synthetic resin layer is interposed between the soft ferrite and the magnetic material base or between the soft ferrite and the laminate silicon steel sheets, it is possible to prevent magnetic saturation in the soft ferrite caused by the magnetic field from the magnetic field generating source such as a permanent magnet constituent and, further which, results in no magnetic saturation partially or entirely in the soft ferrite even under the effect of the magnetic field by the gradient magnetic field coils and can reduce the leakage of magnetic fluxes from the soft ferrite to the magnetic material base or the laminate silicon steel sheets and, as a result, it is possible to reduce the generation of the eddy current and the remanent magnetism in the magnetic material base or the laminate silicon steel sheets caused by the magnetic field from the gradient magnetic field coils, so that the gradient magnetic field by the FSE method or the like required for high speed image pick-up can be put to stable pulse sequence control in the space of the magnetic circuit in the MRI magnetic field generating device.

What is claimed is:

1. A magentic field generating device for use in MRI and having a pair of pole pieces in opposed spaced relation across a gap and generating a magnetic field in the gap, wherein the pole pieces of the pair of pole pieces have a laminate structure in which a soft ferrite and a magnetic material base are disposed, and a layer of small magnetic permeability and high electric resistance is interposed between the soft ferrite and the magnetic material base.

2. A magnetic field generating device for use in MRI as defined in claim 1, wherein said layer has a magnetic permeability of about 1 and an electric reistance at least equal to the specific resistance of the soft ferrite.

3. A magnetic field generating device for use in MRI as defined in claim 2, wherein said layer has a specific resistance of more than 0.2 Ω·m.

4. A magnetic field generating device as defined in claim 2, wherein said layer is made of at least one of the group consisting of synthetic resin, ceramic, hard wood, fiber board, and air.

5. A magnetic field generating device for use in MRI as defined in claim 3, wherein said layer is made of bakelite.

6. A magnetic field generating device for use in MRI as defined in claim 1, wherein the soft ferrite is Ni-Zn type soft ferrite.

7. A magnetic field generating device for use in MRI as defined in claim 1, wherein the magnetic material base is made of at least one of electromagnetic soft iron and pure iron.

8. A magnetic field generating device for use in MRI as defined in claim 1, wherein the soft ferrite is Mn-Zn, said layer is made of bakelite and the magnetic material base is made of pure iron.

9. A magnetic field generating device for use in MRI as defined in claim 1, wherein the magnetic material base is in the shape of a disk, and an annular protrusion comprising a magnetic material ring having one or more diametrical slits is disposed on the gap-facing surface of the pole piece.

10. A magnetic field generating device for use in MRI as defined in claim 1, wherein the magnetic material base is in the shape of a rectangular plate, and protrusions, each in the shape of a rectangular bar made of magnetic material, are disposed on both axial ends at the gap-facing surface of the pole pieces.

11. A magnetic field generating device for use in MRI as defined in claim 1, wherein the ratio between each thickness of the soft ferrite, said layer and the magnetic material base is 5–50:0.5–5:10–50.

12. A magnetic field generating device for use in MRI and having a pair of pole pieces in opposed spaced relation across a gap and generating a magnetic field in the gap, wherein
    the pole pieces of the pair of pole pieces have a laminate structure in which a soft ferrite and a magnetic material base are disposed, and
    a layer of small magnetic permeability and high electric resistance is interposed between the soft ferrite and the laminate silicon steel sheets.

13. A magnetic field generating device for use in MRI as defined in claim 12, wherein said layer has a magnetic permeability of about 1 and an electric reistance at least equal to the specific resistance of the soft ferrite.

14. A magnetic field generating device for use in MRI as defined in claim 13, wherein said layer has a specific resistance of more than 0.2 $\Omega\cdot m$.

15. A magnetic field generating device as defined in claim 12, wherein said layer is made of at least one of the group consisting of synthetic resin, ceramic, hard wood, fiber board, and air.

16. A magnetic field generating device for use in MRI as defined in claim 15, wherein said layer is made of bakelite.

17. A magnetic field generating device for use in MRI as defined in claim 12, wherein the soft ferrite is Ni-Zn type soft ferrite.

18. A magnetic field generating device for use in MRI as defined in claim 12, wherein the silicon steel sheets comprise at least one of a directional and non-directional silicon steel sheet.

19. A magnetic field generating device for use in MRI as defined in claim 12, wherein the magnetic permeability of the laminate silicon steel sheet is at least equal to or greater than the magnetic permeability of the soft ferrite.

20. A magnetic field generating device for use in MRI as defined in claim 12, wherein the magnetic material base is made of at least one of electromagnetic soft iron and pure iron.

21. A magnetic field generating device for use in MRI as defined in claim 12, wherein the soft ferrite is Mn-Zn, said layer is made of bakelite and the magnetic material base is made of pure iron, and the laminate silicon steel sheet is non-directional and the magnetic material base is made of pure iron.

22. A magnetic field generating device for use in MRI as defined in claim 12, wherein the magnetic material base is in the shape of a disk, and an annular protrusion comprising a magnetic material ring having one or more diametrical slits is disposed on the gap-facing surface of the pole piece.

23. A magnetic field generating device for use in MRI as defined in claim 12, wherein the magnetic material base is in the shape of a rectangular plate, and protrusions, each in the shape of a rectangular bar made of magnetic material, are disposed on both axial ends at the space-facing surface of the pole pieces.

24. A magnetic field generating device for use in MRI as defined in claim 12, wherein the ratio between each thickness of the soft ferrite, said layer and the magnetic material base is 5–50:0.5–5:10–50.

* * * * *

UNITED STATES PATENT AND TRADEMARK OFFICE
CERTIFICATE OF CORRECTION

PATENT : 5,631,616
DATED : May 20, 1997
INVENTOR(S) : Kimiharu Ohta et al

It is certified that error appears in the above-identified patent and that said Letters Patent is hereby corrected as shown below:

On the title page, in item [73] Assignee, should be corrected to read as follows:

--Sumitomo Special Metals Co., Ltd., Osaka Japan--.

Signed and Sealed this

Seventh Day of December, 1999

Q. TODD DICKINSON

Attest:

Attesting Officer

Acting Commissioner of Patents and Trademarks